(12) United States Patent
Sengupta et al.

(10) Patent No.: US 8,963,210 B2
(45) Date of Patent: Feb. 24, 2015

(54) STANDARD CELL FOR INTEGRATED CIRCUIT

(75) Inventors: Rwik Sengupta, Grenoble (FR); Rohit Kumar Gupta, Punjab (IN); Mitesh Goyal, Madhya Pradesh (IN); Olivier Menut, Wappingers Falls, NY (US)

(73) Assignees: STMicroelectronics SA, Montrouge (FR); STMicroelectronics, Inc., Coppell, TX (US)

( * ) Notice: Subject to any disclaimer, the term of this patent is extended or adjusted under 35 U.S.C. 154(b) by 626 days.

(21) Appl. No.: 13/238,655

(22) Filed: Sep. 21, 2011

(65) Prior Publication Data

US 2012/0132963 A1 May 31, 2012

(30) Foreign Application Priority Data

Nov. 26, 2010 (FR) ..................... 10 59777

(51) Int. Cl.
*H01L 23/52* (2006.01)
*H01L 27/118* (2006.01)
*H01L 27/02* (2006.01)
*H01L 23/528* (2006.01)

(52) U.S. Cl.
CPC ...... *H01L 27/11807* (2013.01); *H01L 27/0207* (2013.01); *H01L 23/5286* (2013.01); *H01L 2924/0002* (2013.01)
USPC .................. 257/207; 257/206; 257/E21.691; 438/128

(58) Field of Classification Search
CPC ..................... H01L 27/0207; H01L 27/11807; H01L 2924/0002; H01L 2924/00; H01L 21/8221
USPC .................. 257/202, 204, 206, 207, E21.66, 257/E21.691, E27.105, 334; 438/128, 587, 438/598
See application file for complete search history.

(56) References Cited

U.S. PATENT DOCUMENTS

| | | | |
|---|---|---|---|
| 5,923,060 A | | 7/1999 | Gheewala |
| 5,994,726 A | * | 11/1999 | Ikeda et al. .................. 257/207 |
| 6,603,158 B1 | * | 8/2003 | Kajii et al. .................. 257/206 |
| 2004/0159894 A1 | * | 8/2004 | Blisson et al. ............... 257/379 |
| 2006/0033524 A1 | * | 2/2006 | Sushihara ....................... 326/27 |
| 2006/0170052 A1 | * | 8/2006 | Kanamoto et al. ........... 257/351 |
| 2006/0253808 A1 | * | 11/2006 | Zounes ............................ 716/1 |
| 2007/0033548 A1 | * | 2/2007 | Tatsumi .......................... 716/1 |

(Continued)

FOREIGN PATENT DOCUMENTS

| | | |
|---|---|---|
| EP | 0609096 | 8/1994 |
| EP | 0638936 | 2/1995 |

(Continued)

*Primary Examiner* — Cuong Q Nguyen
*Assistant Examiner* — Yosef Gebreyesus
(74) *Attorney, Agent, or Firm* — Allen, Dyer, Doppelt, Milbrath & Gilchrist, P.A.

(57) ABSTRACT

An integrated circuit (IC) cell may include first and second semiconductor regions, and parallel electrically conductive lines extending above the first and second semiconductor regions. The IC cell may further include electrically conductive line contacts electrically connected to the parallel electrically conductive lines, and may include at least one first line contact between the first semiconductor region and a corresponding end of the IC cell, and at least one second line contact between the first semiconductor region and the second semiconductor region. Adjacent ones of the electrically conductive lines may be respectively coupled to one of the at least one first line contact and to one of the at least one second line contact.

24 Claims, 3 Drawing Sheets

(56) References Cited

U.S. PATENT DOCUMENTS

| | | |
|---|---|---|
| 2007/0278525 A1* | 12/2007 | Acharya .................. 257/204 |
| 2007/0300202 A1* | 12/2007 | Uchida .................... 716/17 |
| 2008/0254606 A1* | 10/2008 | Baek et al. .............. 438/585 |
| 2010/0006901 A1 | 1/2010 | Becker et al. |

FOREIGN PATENT DOCUMENTS

| | | |
|---|---|---|
| EP | 1073122 | 1/2001 |
| JP | 03069163 | 3/1991 |

* cited by examiner

STANDARD CELL FOR INTEGRATED CIRCUIT

FIELD OF THE INVENTION

The invention relates to integrated circuits, and, more particularly to standard cells, for example input/output cells.

BACKGROUND OF THE INVENTION

Standard cells are generally produced using complementary metal oxide semiconductor (CMOS) technology, and may be pre-optimized cells saved in cell libraries. Thus, the designer of an integrated circuit may use standard cells by placing them and interconnecting them based upon the structure and functionality of the integrated circuit to be designed.

Conventional topology standard cells may be used down to a 28-nanometer technology node size, which corresponds to the line width, and generally corresponds to the channel length or gate width of a transistor produced in this technology. More precisely, conventional topology input/output standard cells, for example, may comprise n-channel metal-oxide-semiconductor field-effect (nMOS) transistors and p-channel metal-oxide-semiconductor field-effect (pMOS) transistors, and, in particular, the gate contacts may be placed on the gate lines of the cell between the active zones of the nMOS transistors and the active zones of the pMOS transistors. Moreover, the supply rails, for example, formed in the second metallization level M2, are placed at each end of the cell.

For sub-28-nanometer technology, the size of the contacts generally increases, and thus, it may then no longer be possible to place these contacts side by side on the parallel gate lines. Consequently, one approach includes staggering these gate contacts between the active zones of the nMOS transistors and the active zones of the pMOS transistors. However, design constraints would then require the size of these active zone regions, and therefore consequently, the performance of the transistors, to be reduced.

SUMMARY OF THE INVENTION

According to one embodiment, a standard cell topology may be produced in sub-28-nanometer CMOS technology. For example, a standard cell topology may be produced in 20-nanometer CMOS technology, which may allow the performance of the transistors of this cell not to be degraded.

According to one embodiment, some of the gate contacts may be moved towards one of the ends of the cell, and some other of the gate contacts may be placed between the active zones to thereby allow the size of the active zones not to be reduced. This may, consequently, allow the performance of the transistors not to be degraded.

According to one aspect, a standard cell may be produced in sub-28-nanometer technology, for example, in 20-nanometer CMOS technology. The standard cell may include a first region including semiconductor zones, and, in particular, source and drain active zones of first transistors, for example, pMOS transistors. The standard cell may include a second region including semiconductor zones, and, in particular, source and drain active zones of several second transistors, for example, nMOS transistors.

The standard cell may also include parallel electrically conductive lines, and, in particular, gate lines, extending above the first region and the second region. Each gate line may be common to a first transistor and to a second transistor. The standard cell may also include a first group of at least one first electrically conductive line contact, and, in particular, a gate line contact, placed between the first region and the corresponding end of the cell. A second group of at least one second electrically conductive line contact, and, in particular, a gate line contact, may be placed between the first region and the second region. Two adjacent gate lines may be respectively electrically connected to a first line contact and to a second line contact. In other words, a gate line connected to a first gate line contact is not connected to a second gate line contact, and a gate line connected to a second gate line contact is not connected to a first gate line contact.

Moving the first line contacts towards the corresponding end of the cell, and placing the other line contacts between the two regions containing the active zones may allow this free space to be occupied to meet a minimum distance requirement between these two regions. This may also allow the area of the second region including, for example, the active zones of the nMOS transistors, not to be reduced.

According to one embodiment, the cell may include a first set of supply rails extending perpendicular to the gate lines above the first region and the gate lines. The cell may further include a second set of supply rails extending above the gate lines. Placing the first set of supply rails above the first region may give these supply rails a greater degree of positioning freedom than if they were placed at the end of the cell, for example.

According to one embodiment, the first set of supply rails may comprise two aligned end parts and a connection part between the two end parts. The connection part may be substantially parallel to the end parts and not aligned with the end parts. Such an embodiment may especially allow, when a source or drain zone of a transistor of the first region must be connected to a supply rail, located, for example, in the second metallization level, by an electrically conductive connection comprising a contact and a via between the contact and the first metallization level, the minimum distance between this via and other vias connecting other source/drain contacts to other metal lines of the first metallization level to be respected.

Although it may be possible to place the second set of supply rails at the end of the cell, it may be particularly advantageous for this set to extend above the second region, thereby also providing a greater degree of freedom for the placement of these supply rails.

This second set of supply rails may, like the first, may comprise two aligned end parts and a connection part between the two end parts. The connection part may be substantially parallel to the end parts and not aligned with the end parts.

According to one embodiment, the distance between the first region and the corresponding end of the cell may be larger than the distance between the second region and the other corresponding end of the cell. The two regions may be located at different distances from the median axis of the cell.

This placement asymmetry of the two regions of semiconductor zones is possible because of the distribution of the line contacts mentioned above, and it may especially allow active-zone areas compatible with the desired performance of the transistors to be preserved.

According to another aspect, an integrated circuit may include several standard cells, such as, for example, the standard cells defined above. In one embodiment, in particular when these cells are input/output cells, the first set of supply rails and the second set of supply rails of a cell may respectively make contact with the first set of supply rails and the second set of supply rails of an adjacent cell. This allows electrical continuity of the supply rails from one cell to another to be ensured.

Other advantages and features of the invention will become clear on examining the detailed description of non-limiting embodiments and the appended drawings.

DETAILED DESCRIPTION OF THE PREFERRED EMBODIMENTS

Figure 1:
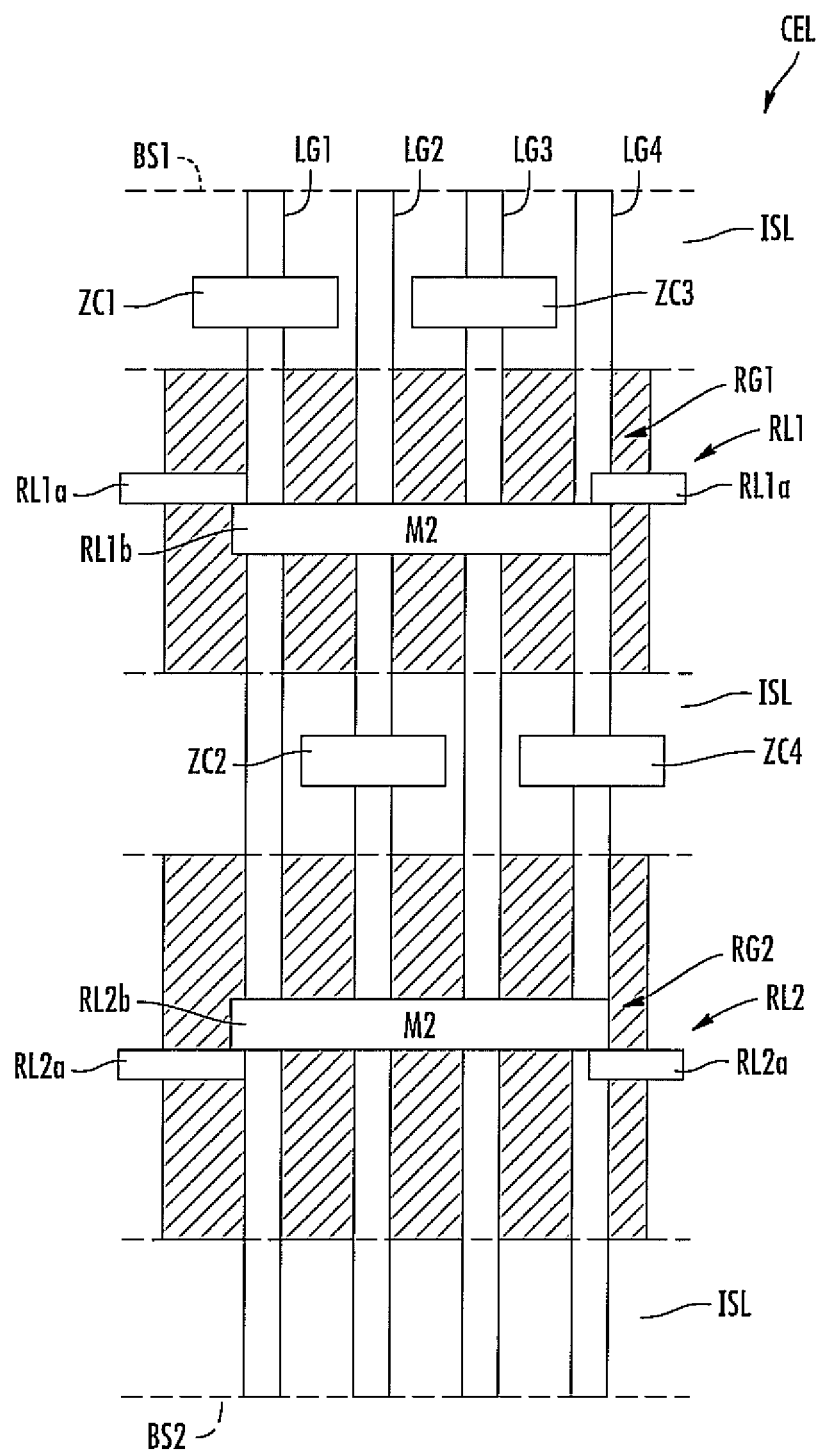
FIG. 1 is a schematic diagram of a cell according to the present invention.
Figure 2:
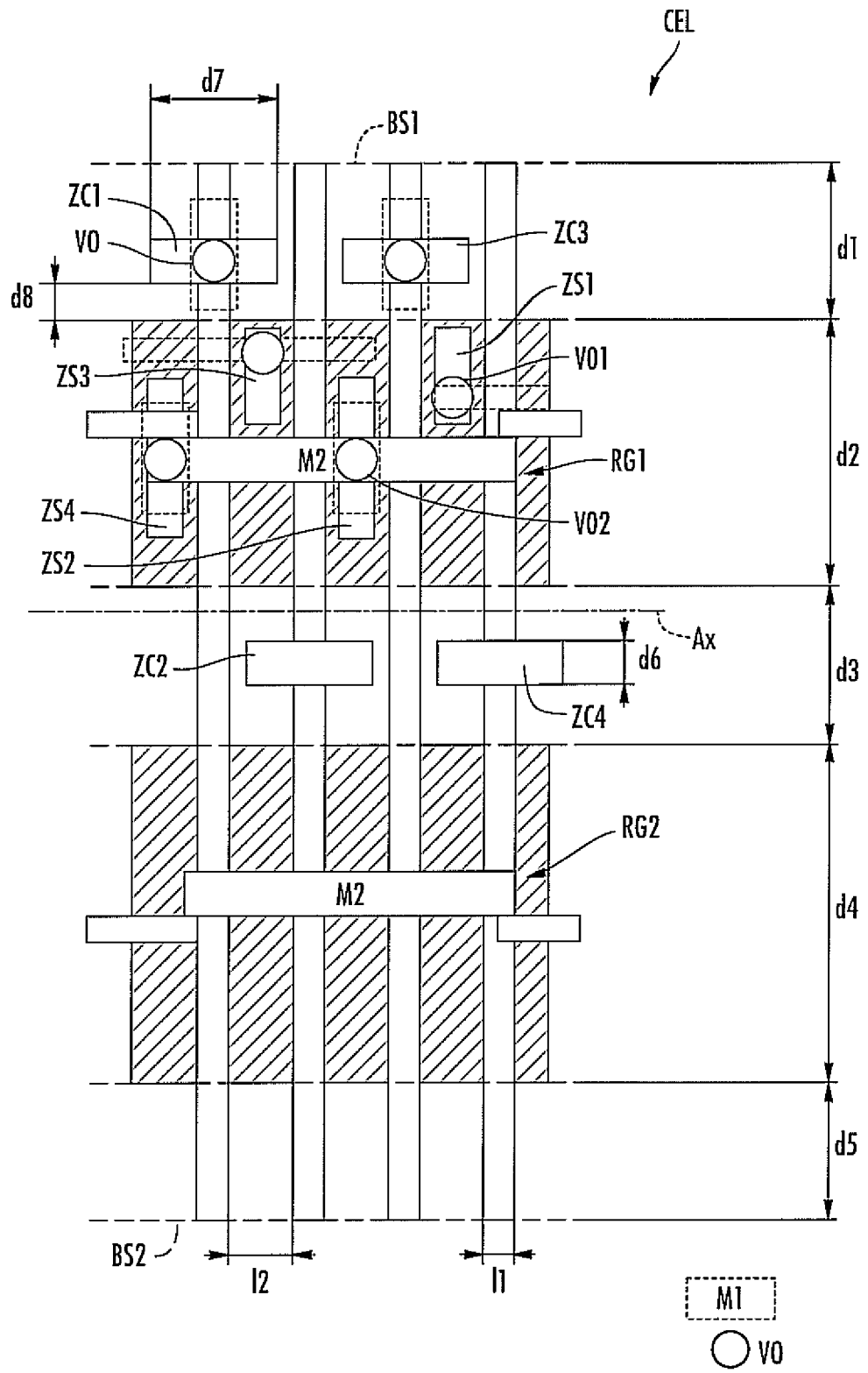
FIG. 2 is another schematic diagram of the cell according to the present invention.

Although the invention applies to any standard cell produced in sub-28-nanometer technology, and especially sub-20-nanometer or 20-nanometer technology, FIGS. 1 and 2 schematically illustrate an exemplary topology for a standard cell produced in 20-nanometer CMOS technology.

The standard cell CEL is illustratively an input/output cell comprising pMOS transistors and nMOS transistors. In the illustrated example, the source and drain active zones of the pMOS transistors are located in the first region RG1, whereas the source and drain active zones of the nMOS transistors are located in the second region RG2. The regions RG1 are surrounded by isolating regions ISL, for example, shallow trench isolation (STI) regions.

The references LG1, LG2, LG3, and LG4 denote lines, for example, made of polycrystalline silicon, forming the transistors of the cell CEL gate lines. These gate lines are parallel. The cell CEL comprises, by way of non-limiting example, four gate lines. The electrically conductive lines LGi may be, for example, made of metal and/or of polysilicon. Moreover, each gate line LGi is common to an nMOS transistor and to a pMOS transistor.

As is conventional, the gate lines are flanked by isolating regions, commonly called "spacers" by those skilled in the art, which are not shown for the sake of simplicity. Each gate line LGi is electrically connected to a metal line in the first metallization level M1 of the cell by at least one electrically conductive contact ZCi surmounted by a via. The vias connecting the contacts to the first metallization level are denoted "vias V0". Logic signals internal to the standard cell are routed, in the example described, by way of metal lines in the metallization level M1.

As illustrated most particularly in FIG. 1, each contact ZC1-ZC4 is, in the technology used, substantially rectangular. More precisely, the width d6 of a gate contact (FIG. 2) is about 30 nanometers, whereas the length d7 of this gate contact is about 40 nanometers.

Based upon the technology used (20-nanometer technology), the width 11 of the gate lines is 20 nanometers, and each gate contact ZCi extends beyond the gate line at each end to rest, in part, on the spacers. As is conventional, the gate line LGi is electrically connected to the corresponding gate contact ZCi by way of a silicided region.

Moreover, as illustrated in FIGS. 1 and 2, two adjacent gate lines are electrically connected respectively to a first gate contact and to a second gate contact. The first gate contacts ZC1 and ZC2 are placed between the first region RG1 and the corresponding end BS1 of the cell CEL. The second gate contacts ZC2 and ZC4 are placed between the two regions RG1 and RG2. The corresponding end of the cell is the end of the cell located opposite the edge of the region of active zones in the direction of the gate lines. The length d7 of each gate contact and the position of these gate contacts is thus compatible with the spacing 12 (about 66 nanometers) between two adjacent gate lines.

More precisely, in FIG. 1, the line LG1 is electrically connected to the gate contact ZC1. The adjacent line LG2 is electrically connected to the gate contact ZC2. Likewise, the line LG3, which is adjacent to the lines LG2 and LG4, is electrically connected to the first gate contact ZC2. The line LG4 is electrically connected to the second gate contact ZC4.

In the example described, the width d2 of the region RG1 and the width d4 of the region RG2 are both equal to 200 nanometers. Moreover, as is well known to a person skilled in the art, design rules impose minimum distances, especially between the two regions RG1 and RG2, and between a gate contact and the edge of one of the regions including source and drain active zones.

In the illustrated example, the distance d3 between the two regions RG1 and RG2, equal to 100 nanometers, may allow the minimum distance between the two regions RG1 and RG2 to be respected, and may permit the placement of second gate contacts ZC2 and ZC4 between these two regions, for example, half-way between the two regions RG1 and RG2. Thus, the minimum distance between the gate contacts ZC2 and ZC4 and the edge of each of the regions RG1 and RG2 is respected.

Moreover, the distance d1 between the edge BS1 of the cell and the edge of the first region RG1 is equal to 100 nanometers, thereby providing a distance d8 of 25 nanometers between the edge of a first gate contact ZC1 or ZC3 and the corresponding edge of the first region RG1. The minimum distance between a gate contact and the first region RG1 is therefore respected. The distance d5 between the edge of the second region RG2 and the other corresponding end BS2 of the cell (i.e., the end which is opposite the second region in the direction of the gate lines) is here equal to 40 nanometers.

The total length of the standard cell is therefore equal to about 640 nanometers, thereby effectively corresponding to a standard length for such a cell in 20-nanometer technology. In this footprint, the topology illustrated in FIGS. 1 and 2 provides transistor active zones of sizes compatible with the expected transistor performance and design-rule-compatible gate contact positions. It should be noted in this respect that the distance between the first region RG1 and the median axis Ax (FIG. 2) of the cell is smaller than the distance between the second region RG2 and the median axis Ax, perpendicular to the gate lines.

The cell CEL moreover comprises a first set of supply rails RL1 located in the second metallization level M2, and a second set of supply rails RL2 also located in the second metallization level. Each set of supply rails comprises, for example, a rail dedicated to a supply voltage Vdd and a rail dedicated to ground Gnd.

As illustrated in this exemplary embodiment, in FIGS. 1 and 2, the first supply rail RL1 comprises two aligned end parts RL1a, and a connection part RL1b connected to the end parts RL1a. The connection part is parallel to these end parts and is not aligned with these end parts.

Such a metallization configuration may especially allow, as will now be shown, design rules to be respected relative to vias V0. More precisely, the source and drain zones of the transistors of the first region RG1 comprise source/drain contacts, and in particular, linear rectangular portions ZS1, ZS2, ZS3 and ZS4. These contacts are electrically connected to the source and drain zones also by silicided parts located on the surface of these source and drain zones. These contacts ZSi are connected to metal lines in the first metallization level M1 by vias V0.

In the example illustrated in FIGS. 1 and 2, the source/drain contact ZS2 is connected to a supply rail by a via V02. Moreover, the source/drain contact ZS1 is connected to a metal line of the metallization level M1 by a via V01. The lateral offset between the end part RL1a on the right and the connection part RL1b of the set of supply rails RL1 may allow sufficient distance to be preserved between the two vias VO1 and V02, thereby allowing the design-rule-required minimum distance between two vias V0, which may typically be equal to 127 nanometers in 20-nanometer CMOS technology, to be respected.

Moreover, the position of the end parts RL1a, laterally offset relative to the connection part RL1b, allows these end parts to be positioned at a distance chosen relative to the edges of the cell. The distance which is standardized may allow, as will be seen in greater detail below, two adjacent cells to make mutual contact by way of their respective sets of supply rails.

The second set of supply rails RL2 may also have, as illustrated in FIGS. 1 and 2, aligned end parts RL2a that are laterally offset relative to a connection part RL2b. Accordingly, such a configuration is may not be absolutely necessary if the configuration of the source/drain contacts of the active zones of the second region RG2 allows respect of the design rules by the vias V0.

A standard cell of the type described with reference to FIGS. 1 and 2 may be stored in a cell library, and be used to produce integrated circuits. For example, such a cell may be an input/output cell.

Figure 3:
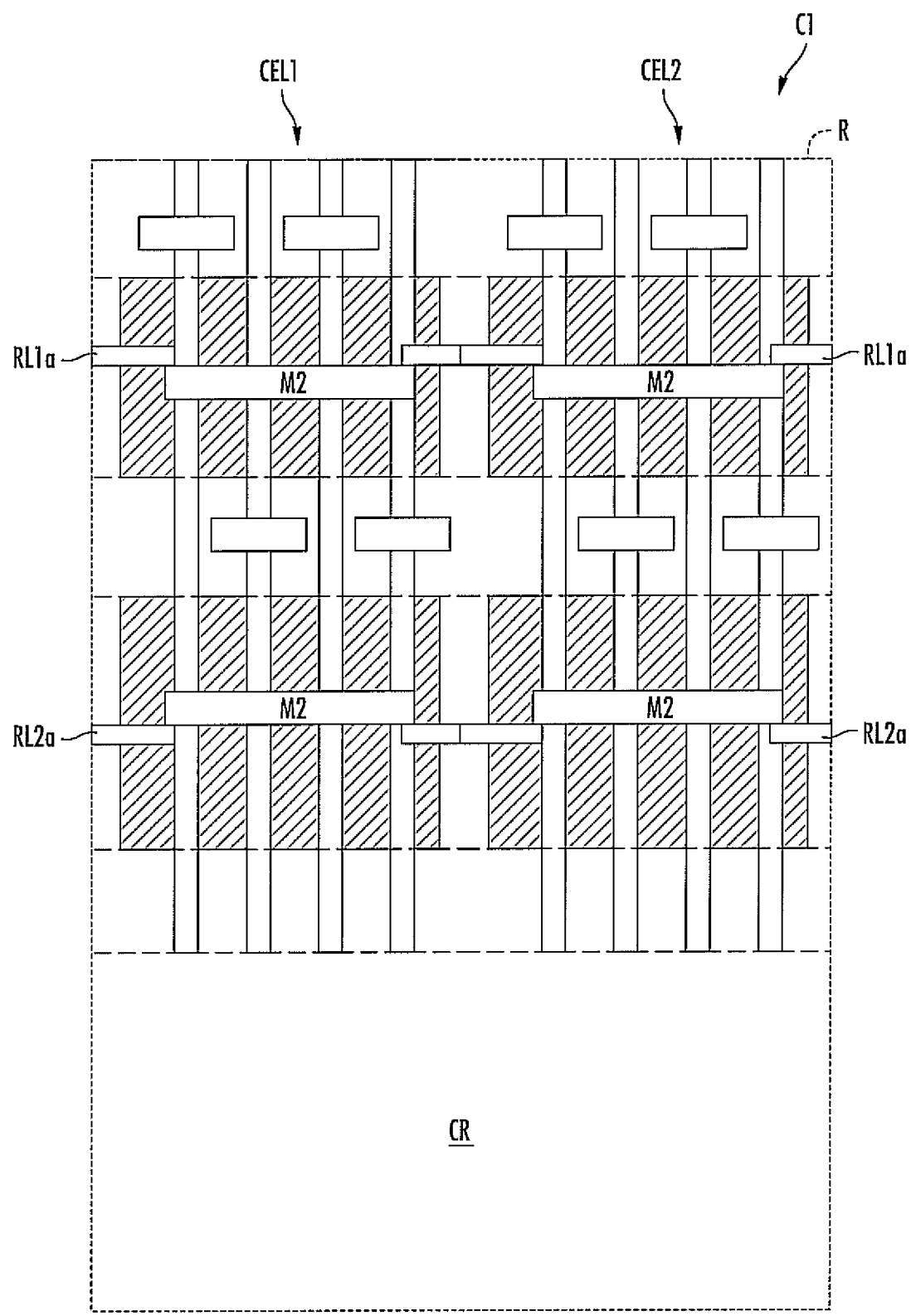
FIG. 3 is a schematic diagram of an integrated circuit according to the present invention.

These input/output cells may, as illustrated in FIG. 3, be placed in a ring R surrounding the core CR of the integrated circuit, which may include conventional components, such as, for example a processor.

To ensure the electrical continuity of the supply rails, two adjacent cells CEL1, CEL2 may make mutual contact by end parts RL1a and RL2a of their respective sets of supply rails RL1 and RL2.

The invention is not limited to the embodiments described above but includes all the variants thereof. Thus, even though four gate lines were shown in the cell, the invention is applicable to any standard cell comprising at least two gate lines.

Moreover, even though the first region RG1 was shown, for example, in the top part of FIGS. 1 and 2, and the second region RG2 in the bottom part RG2, the first region may have been designated to be the bottom region and the second region the top region. Likewise, the first gate contacts may have been located between the bottom region and the corresponding end of the cell.

That which is claimed:

1. An integrated circuit (IC) cell comprising:
   first and second semiconductor regions;
   a plurality of parallel electrically conductive lines extending above the first and second semiconductor regions;
   electrically conductive line contacts electrically coupled to said plurality of parallel electrically conductive lines and comprising
     at least one first line contact between the first semiconductor region and a corresponding end of the IC cell, and
     at least one second line contact between the first semiconductor region and the second semiconductor region;
   adjacent ones of said plurality of electrically conductive lines being respectively coupled to one of said at least one first line contact and to one of said at least one second line contact;
   a first set of supply rails perpendicular to said plurality of parallel electrically conductive lines above said first semiconductor region and said plurality of parallel electrically conductive lines; and
   a second set of supply rails perpendicular to said plurality of parallel electrically conductive lines above said electrically conductive lines.

2. The IC cell according to claim 1, wherein said first set of supply rails comprises two aligned end parts and a connection part between the two end parts, the connection part being parallel to said end parts and being offset with said end parts.

3. The IC cell according to claim 1, wherein said second set of supply rails is above the second semiconductor region.

4. The IC cell according to claim 3, wherein said second set of supply rails comprises two aligned end parts and a connection part between the two end parts, the connection part being parallel to said end parts and being offset with said end parts.

5. The IC cell according to claim 1, wherein said first and second semiconductor regions each have a plurality of semiconductor zones; wherein the plurality of semiconductor zones of the first semiconductor region define source and drain zones of a plurality of first transistors; wherein the plurality of semiconductor zones of the second semiconductor region define source and drain zones of a plurality of second transistors; wherein said plurality of parallel conductive lines define gate lines; and wherein the electrically conductive line contacts define gate contacts.

6. The IC cell according to claim 1, wherein the IC cell has a line width less than 28 nanometers.

7. The IC cell according to claim 1, wherein the IC cell has a line width less than or equal to 20 nanometers.

8. The IC cell according to claim 1, wherein a distance between the first semiconductor region and the corresponding end of the IC cell is larger than a distance between the second semiconductor region and another corresponding end of the IC cell.

9. The IC cell according to claim 1, wherein the first and second semiconductor regions are at different distances from a median axis of the IC cell perpendicular to said plurality of electrically conductive lines.

10. An integrated circuit (IC) comprising:
    a plurality of IC cells, each IC cell comprising
      first and second semiconductor regions,
      a plurality of parallel electrically conductive lines extending above the first and second semiconductor regions,
      electrically conductive line contacts electrically coupled to said plurality of parallel electrically conductive lines and comprising
        at least one first line contact between the first semiconductor region and a corresponding end of the IC cell, and
        at least one second line contact between the first semiconductor region and the second semiconductor region,
      adjacent ones of said plurality of electrically conductive lines being respectively coupled to one of said at least one first line contact and to one of said at least one second line contact,
      a first set of supply rails perpendicular to said plurality of parallel electrically conductive lines above said first semiconductor region and said plurality of parallel electrically conductive lines, and
      a second set of supply rails perpendicular to said plurality of parallel electrically conductive lines above said plurality of parallel electrically conductive lines.

11. The integrated circuit according to claim 10, wherein said first set of supply rails and said second set of supply rails of a given one of said plurality of IC cells respectively make contact with said first set of supply rails and said second set of supply rails of an adjacent one of the plurality of IC cells.

12. The integrated circuit according to claim 10, wherein said first set of supply rails comprises two aligned end parts and a connection part between the two end parts, the connection part being parallel to said end parts and being offset with said end parts.

13. The integrated circuit according to claim 10, wherein said second set of supply rails is above the second semiconductor region.

14. The integrated circuit according to claim 13, wherein said second set of supply rails comprises two aligned end parts and a connection part between the two end parts, the connection part being parallel to said end parts and being offset with said end parts.

15. The integrated circuit according to claim 10, wherein said first and second semiconductor regions each have a plurality of semiconductor zones; wherein the plurality of semiconductor zones of the first semiconductor region define source and drain zones of a plurality of first transistors; wherein the plurality of semiconductor zones of the second semiconductor region define source and drain zones of a plurality of second transistors; wherein said plurality of parallel electrically conductive lines define gate lines; and wherein the electrically conductive line contacts define gate contacts.

16. The integrated circuit according to claim 10, wherein each IC cell has a line width less than 28 nanometers.

17. The integrated circuit according to claim 10, wherein each IC cell has a line width less than or equal to 20 nanometers.

18. A method of making a IC cell comprising:
forming first and second semiconductor regions;
forming a plurality of parallel electrically conductive lines to extend above the first and second semiconductor regions;
coupling electrically conductive line contacts electrically to the plurality of parallel electrically conductive lines, the electrically conductive line contacts comprising
at least one first line contact between the first semiconductor region and a corresponding end of the IC cell, and
at least one second line contact between the first semiconductor region and the second semiconductor region;
adjacent ones of the plurality of electrically conductive lines being respectively coupled to one of the at least one first line contact and to one of at least one second line contact;
forming a first set of supply rails perpendicular to the plurality of parallel electrically conductive lines above the first region and the plurality of parallel electrically conductive lines; and
forming a second set of supply rails perpendicular to the plurality of parallel electrically conductive lines above the plurality of parallel electrically conductive lines.

19. The method according to claim 18, wherein the first set of supply rails comprises two aligned end parts and a connection part between the two end parts, the connection part being parallel to the end parts and being offset with the end parts.

20. The method according to claim 18, wherein the second set of supply rails is formed above the second semiconductor region.

21. The method according to claim 20, wherein the second set of supply rails comprises two aligned end parts and a connection part between the two end parts, the connection part being parallel to the end parts and being offset with the end parts.

22. The method according to claim 18, wherein the first and second semiconductor regions each have a plurality of semiconductor zones; wherein the plurality of semiconductor zones of the first semiconductor region define source and drain zones of a plurality of first transistors; wherein the plurality of semiconductor zones of the second semiconductor region define source and drain zones of a plurality of second transistors; wherein the plurality of parallel electrically conductive lines define gate lines; and wherein the electrically conductive line contacts define gate contacts.

23. The method according to claim 18, wherein the IC cell has a line width less than 28 nanometers.

24. The method according to claim 18, wherein the IC cell has a line width less than or equal to 20 nanometers.

* * * * *